(12) United States Patent
Choi et al.

(10) Patent No.: US 6,803,176 B2
(45) Date of Patent: Oct. 12, 2004

(54) METHODS FOR FORMING LINE PATTERNS IN SEMICONDUCTOR SUBSTRATES

(75) Inventors: Sang-jun Choi, Seoul (KR); Yool Kang, Kyungki-do (KR); Joo-tae Moon, Kyungki-do (KR); Jeong-hee Chung, Kyungki-do (KR); Sang-gyun Woo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 223 days.

(21) Appl. No.: 10/227,067

(22) Filed: Aug. 23, 2002

(65) Prior Publication Data

US 2003/0054292 A1 Mar. 20, 2003

Related U.S. Application Data

(63) Continuation of application No. 09/533,770, filed on Mar. 23, 2000, now Pat. No. 6,485,895.

(30) Foreign Application Priority Data

Apr. 21, 1999 (KR) .............................. 99-14271
Nov. 16, 1999 (KR) .............................. 99-50903

(51) Int. Cl.[7] .............................................. G03F 7/40
(52) U.S. Cl. .................... 430/330; 430/311; 430/313; 430/326; 430/322
(58) Field of Search .............................. 430/311, 330, 430/313, 326, 322

(56) References Cited

U.S. PATENT DOCUMENTS

| | | | |
|---|---|---|---|
| 4,022,932 A | 5/1977 | Feng | |
| 4,259,430 A | 3/1981 | Kaplan et al. | |
| 5,096,802 A | 3/1992 | Hu | |
| 5,510,420 A | 4/1996 | Dammel et al. | |
| 5,858,620 A | 1/1999 | Ishibashi et al. | |
| 5,882,843 A | 3/1999 | Kudo et al. | |
| 6,072,006 A | 6/2000 | Bantu et al. | |
| 6,280,897 B1 | 8/2001 | Asakawa et al. | |
| 6,358,672 B2 | 3/2002 | Jeoung et al. | |
| 6,579,657 B1 | 6/2003 | Ishibashi et al. | |
| 2002/0028405 A1 | 3/2002 | Kim et al. | |
| 2002/0048723 A1 | 4/2002 | Lee et al. | |

FOREIGN PATENT DOCUMENTS

| | | |
|---|---|---|
| EP | 1 099 983 A1 | 5/2001 |
| JP | 6-266101 A | 9/1994 |
| JP | 6266101 | 9/1994 |
| JP | 7-261392 A | 10/1995 |
| JP | 8-211607 A | 8/1996 |
| JP | 10-73927 A | 8/1998 |
| KR | 1998-080853 | 11/1998 |

OTHER PUBLICATIONS

Notice to Submit Response, Korean App. No. 10–1999–0050903, Nov. 10, 2003.
Yamauchi et al., *0.2 μm Hole Pattern Generation by Critical Dimension Biassing Using Resin Ovarcoat*, Jpn. J. Appl. Phys 34:Pt. 1 12B 6615–6621 (Dec., 1995).
Notice to Submit Response, Korean Application No. 10–1999–0050903, Nov. 15, 2001.

*Primary Examiner*—John A. McPherson
*Assistant Examiner*—Daborah Chacko-Davis
(74) *Attorney, Agent, or Firm*—Myers Bigel Sibley & Sajovec

(57) ABSTRACT

A method for forming a fine pattern in a semiconductor substrate, by coating a target layer to be etched on a semiconductor substrate with a resist composition including at least one compound capable of forming a photoresist pattern by a photolithography process, and a free radical initiator. The free radical initiator is capable of being decomposed by a thermal process at a temperature equal to or higher than the glass transition temperature of the at least one compound. A lithography process is performed on the resist compound layer to form a photoresist pattern. The resist compound layer having the photoresist pattern formed therein is heated to a temperature equal to or higher than the glass transition temperature of the at least one compound, and wherein a partial cross-linking reaction in the resist composition occurs.

48 Claims, 2 Drawing Sheets

METHODS FOR FORMING LINE PATTERNS IN SEMICONDUCTOR SUBSTRATES

CROSS-REFERENCE TO RELATED APPLICATIONS

This application is a continuation of U.S. application Ser. No. 09/533,770, filed Mar. 23, 2000 now U.S. Pat. No. 6,485,895 and also claims the benefit of Korean Application Nos. 99-14271, filed Apr. 21, 1999, and 99-50903, filed Nov. 16, 1999, the disclosures of all of which are hereby incorporated herein by reference in their entirety as if set forth fully herein.

FIELD OF THE INVENTION

The invention generally relates to methods for fabricating semiconductor substrates and compositions of matter employed in such methods.

BACKGROUND OF THE INVENTION

In a general process for forming patterns for semiconductor memory devices, after a photoresist pattern is formed on a predetermined target layer to be etched for forming patterns, the target layer is typically etched to a desired pattern using the photoresist pattern as an etching mask. Examples of target layers include silicon layers, insulating layers, or conductive layers. Because of the ever increasing integration of semiconductor devices, it is important to develop lithography technology to form contact holes in the semiconductor devices having smaller opening sizes or finer patterns having narrower spaces. Stated differently, it is believed important to develop design criteria for smaller critical dimensions (CD) in the devices.

A photolithography technique employed for forming fine contact holes uses E-beam lithography with an exposure tool of shorter wavelength and a method that uses a half-tone phase shift mask. In particular, the method employing the exposure tool of shorter wavelength is believed to be disadvantageous in that it is material-intensive and thus relatively expensive to implement. Moreover, a method that utilizes the half-tone phase shift mask is believed to possess limitations in mask manufacturing technology and resolution. Accordingly, it may be difficult to obtain contact holes smaller than 150 nm.

In an attempt to meet the demand for devices with smaller feature sizes, efforts have focused on reducing the opening size or space by applying heat to a photoresist pattern such that the photoresist is able to flow. An example of this technique includes coating a resist layer on a wafer patterned by a photolithography process and then causing the photoresist pattern to flow by heating the resist layer to a temperature that is higher than the glass transition temperature or the softening temperature of the resist layer to reduce the CD of the resultant resist pattern.

Notwithstanding any possible advantages, the above procedure is potentially disadvantageous in that the flow rates in the upper and middle parts of the photoresist pattern are often different. This difference is believed to result in the photoresist pattern having a bowed profile. The bowed profile is believed to be caused by a swelling phenomenon occurring in the middle part of the photoresist pattern. Due to the difficulty in controlling the flow rate of the photoresist pattern by employing conventional resist flow technology, it is often extremely difficult to reduce the CD of the photoresist pattern while maintaining a vertical pattern profile.

U.S. Pat. No. 5,096,802 proposes a photolithographic process for producing a component with reduced feature sizes. The '802 patent proposes controlling the flow rate of a resist through hard baking and deep-UV (DUV) exposure, resulting in the reduced feature sizes. Potential problems may be associated with the '802 patent. For example, the side walls of openings formed in the flowed resist are typically tapered. Accordingly, a target layer underneath the resist pattern is resultantly etched along the tapered side walls during subsequent dry etching. Thus, the upper and lower parts of the openings may have different critical dimensions. In general, the degree of tapering at the side walls of the opening tends to vary among the openings, thereby undesirably causing different critical dimensions to a plurality of holes formed in the target layer over the entire wafer surface. As such, it is typically difficult to obtain a good sidewall profile in a flowed photoresist pattern employing conventional technology.

SUMMARY OF THE INVENTION

It is an object of the present invention to provide methods for forming fine patterns through thermal flowing of photoresist patterns, in which distortion of the profile at the side walls of openings or spaces is minimized, leading to a further reduction in smaller feature size.

It is another object of the present invention to provide compositions suitable for forming fine patterns which go beyond the wavelength limit in a photolithography technology.

In one aspect, the invention provides methods for forming fine patterns in semiconductor substrates. The method first comprises coating a target layer to be etched on a semiconductor substrate with resist compositions. The resist compositions comprise compounds capable of forming a photoresist pattern by a photolithography process, and crosslinking agents. The crosslinking agents are those which are capable of causing partial crosslinking reactions at temperatures equal to or higher than the glass transition temperatures or the softening temperatures of the compounds. The coating steps result in forming resist compound layers comprising the compounds. Thereafter, lithography processes are performed on the resist compound layers to form photoresist patterns of at least one opening having a first width, wherein the target layer is exposed through the first width. Next, the resist compound layers having the photoresist patterns formed therein are heated to temperatures equal to or higher than the glass transition temperatures or the softening temperatures of the compounds, and partial cross-linking reactions in the resist compositions occur. Modified photoresist patterns result having at least one opening having a second width which exposes the target layer, wherein the second width is smaller than the first width. The methods of the invention are believed to be desirable in that the flow rates of the photoresist patterns may be controlled. Moreover, the methods are potentially simpler relative to conventional methods.

In another aspect, the invention provides resist compositions. The resist compositions comprise compounds capable of forming photoresist patterns by photolithography processes, and crosslinking agents. The crosslinking agents are capable of causing partial cross-linking reactions in the resist compositions to form resist compounds at temperatures equal to or higher than the glass transition temperatures or the softening temperatures of the compounds. The crosslinking agents are advantageous in that they may be employed with a number of compounds without adversely affecting the performance of the resist compositions.

In addition to the above, the invention is potentially advantageous in that the distortion of the profile at the side walls of contact holes is minimized, thus allowing for the formation of vertical sidewall profiles. In addition, fine openings which go beyond the wavelength limits in general photolithography technologies can be formed in the photoresist patterns.

DETAILED DESCRIPTION OF THE PREFERRED EMBODIMENTS

Figure 1A:
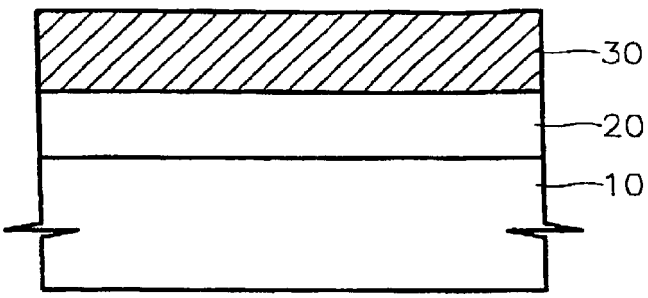
FIGS. 1A through 1D are sectional views illustrating the sequence of steps in a method for forming a fine pattern according to a preferred embodiment of the present invention.

The present invention now will be described more fully hereinafter with reference to the accompanying drawings and examples, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

In one aspect, the invention relates to methods for forming fine patterns in semiconductor substrates. The method first comprises coating target layers to be etched on semiconductor substrates with resist compositions (e.g., solutions). The resist compositions comprise compounds capable of forming photoresist patterns by photolithography processes and crosslinking agents. The crosslinking agents are those which are capable of causing partial crosslinking reactions in the resist compositions at temperatures equal to or higher than the glass transition temperatures or the softening temperatures of the compounds. The compositions are described in greater detail herein.

The coating steps result in forming resist compound layers comprising the resist compositions. Thereafter, lithography processes are performed on the resist compound layers to form photoresist patterns of at least one opening having a first width, wherein the target layer is exposed through the first width. Preferably, a plurality of openings are formed having the first width. Next, the resist compound layers having the photoresist patterns formed therein are heated to temperatures equal to or higher than the glass transition temperatures or the softening temperatures of the compounds wherein partial cross-linking reactions in the resist compositions occur. Modified photoresist patterns result having at least one opening of a second width which exposes the target layer, wherein the second width is smaller than the first width. Preferably, a plurality of openings having the second width are formed.

In a preferred embodiment, the heating of the resist compound layers to temperatures equal to or higher than the glass transition temperatures or the softening temperatures of the compounds causes the resist compound layers to flow with partial cross-linking reactions occurring and the formation of at least one opening of a second width resulting.

In various preferred embodiments, the steps of heating the resist compound layers comprises heating the resist compound layers having the photoresist patterns formed therein to first temperatures which are equal to or higher than the glass transition temperatures or the softening temperatures of the resist compositions. Thereafter, the resist compound layers having the photoresist patterns formed therein are cooled to room temperature. The resist compound layers having the photoresist patterns formed therein are then heated to second temperatures which are higher than the first temperatures.

In various preferred embodiments, the methods of the invention may further comprise cooling the resist compound layers having the photoresist patterns formed therein; and heating the resist compound layers having the photoresist patterns formed therein to temperatures equal to or higher than the glass transition temperatures or the softening temperatures of the compounds. In these embodiments, the cooling and heating steps occur subsequent to the step of heating the resist compound layers having the photoresist patterns formed therein to second temperatures.

In certain preferred embodiments, the step of heating the resist compound layers having the photoresist patterns formed therein to temperatures equal to or higher than the glass transition temperatures or softening temperatures of the compounds comprise heating the resist compound layers to temperatures that exceed the glass transition temperatures or softening temperatures by about 5° C. to about 20° C.

In various preferred embodiments, the step of heating the resist compound layers having the photoresist patterns formed therein to temperatures equal to or higher than the glass transition temperatures or softening temperatures is carried out from about 60 to about 180 seconds.

The methods of the invention may also comprise forming target layers to be etched on semiconductor substrates.

In another aspect, the invention provides resist compositions. The resist compositions comprise compounds capable of forming photoresist patterns by photolithography processes, and crosslinking agents capable of causing partial cross-linking reactions in the compounds at temperatures equal to of higher than the glass transition temperatures or the softening temperatures of the at least one compounds to form resist compounds.

Various components may be employed as compounds capable of forming photoresist patterns by photolithography processes. As an example, the resist compositions may comprise compounds selected from the groups consisting of Novolak resins, diazonaphthoquinone (DNQ) compounds, and mixtures thereof. Most preferably, the compounds that are employed are Novolak resins and diazonaphthoquinone compounds in combination.

In certain embodiments, the resist compositions may be present in the form of chemically amplified resist compositions comprising photo acid generators (PAG).

A number of crosslinking agents may be used in the present invention. In one embodiment, the crosslinking agent is a vinylether derivative. An example of a vinylether derivative is represented by the formula:

wherein x is an integer ranging from 2 to 4; and R is a $C_1$ to $C_{20}$ hydrocarbon or an oligomer having a weight average molecular weight ranging from about 500 to about 5000. Specific examples of vinyl ethers that can be employed as crosslinking agents include, but are not limited to, 1,4- butandiol divinyl ether, tri(ethyleneglycol)divinyl ether, trimethyolpropane trivinyl ether, 1,4-cyclohexanedimethanol divinyl ether, and mixtures thereof.

In other embodiments, the crosslinking agents may be in the form of free radical initiators. In general, the free radical initiators are preferably selected from those that are capable of being decomposed at temperatures equal to or greater than the glass transition temperatures or the softening temperatures of the at least one compounds. Thus, free radicals are produced which effect the partial crosslinking reactions. Exemplary free radical initiators may include, but not be limited to, acyl peroxides, alkyl peroxides, peresters, hydroperoxides, and azo compounds. In another embodiment, the free radical initiators are selected from the group consisting of benzoyl peroxide, dicumyl peroxide, di-tert-butyl peroxide, cumyl hydroperoxide, and azobis (isobutyronitrile). Other free radical initiators may be employed if so desired.

Various amounts of the crosslinking agent may be employed. Preferably, the crosslinking agent is present in an amount from about 1 to about 20 percent based on the weight of polymer present in said at least one compound. More preferably, the resist compositions comprise from about 1 to about 15 percent by weight of the free radical initiators based on the weight of the solids in the resist compositions. Most preferably, the resist compositions comprise from about 3 to about 15 percent by weight of the free radical initiators based on the weight of the solids in the resist compositions.

The resist compositions may comprise various other materials. In one embodiment, the resist compositions comprise organic bases. The organic bases may be present in various amounts. Preferably, the organic bases are present in amounts of from about 0.01 to about 2.0 percent by weight based on the resist compositions. Examples of organic bases that may be employed include, but are not limited to, N,N'-dimethylaniline, N,N'-diethylaniline, triethylamine, triisobutylamine, diethanolamine, and triethanolamine.

The invention will now be described further with reference to the drawings. It should be appreciated that the embodiments referred to in the drawings are for illustrative purposes only, and are not to be construed as limiting the invention.

FIG. 1A refers to a method for forming a fine pattern according to a preferred embodiment of the present invention. As shown, a target layer 20 is formed on a semiconductor substrate 10 and is etched to form a pattern having, for example, contact holes. The target layer 20 may be in the form of various layers, such as, for example, an insulation layer including a silicon layer, an oxide layer or a nitride layer, and a conductive layer. In order to form contact holes in the target layer 20, the target layer 20 is preferably formed as an insulation layer made of an oxide.

Then, a resist composition comprising at least one compound used in a general photolithography process and a crosslinking agent that is capable of causing a partial crosslinking reaction in the at least one compound by a thermal process higher than the glass transition temperature or the softening temperature (hereinafter the glass transition temperature or the softening temperature shall be referred to as the "transition temperature" for convenience of description), is coated on the target layer 20, resulting in a resist compound layer 30.

The resist composition of the resist compound layer 30 may by any resist composition for G-line, i-line, deep-UV, ArF, E-beams or X-rays. Also, the resist composition may have a positive or negative polarity.

In a preferred embodiment, the resist composition may comprise a Novolak resin and a DNQ compound. The resist composition may be in the form of a general chemically amplified resist composition containing a photo acid generator (PAG).

The crosslinking agent of the resist compound layer 30 may be added for easier control of the flow rate of the resist composition in a photoresist pattern during thermal flowing of the photoresist pattern.

The crosslinking agent preferably should be selected so as to not affect the performance of the resist composition, which may occur during a general photolithography process. Also, it may be important to select an appropriate crosslinking agent in consideration of sensitivity, transmittance or shelf life of the resist compound that is eventually formed by mixing the crosslinking agent with the at least one compound.

In embodiments wherein a free radical initiator is used as the crosslinking agent, an organic base can be further added to the resist composition which may result in a redox initiation system in order to potentially facilitate the formation of free radicals by the free radical initiator. Such a system is believed to encompass an oxidation-reduction reaction between the free radical initiator and the organic base in the resist composition. Thus, the reactivity of the free radical initiator can be potentially controlled by adding the organic base to the resist composition. Examples of organic bases which can be used in the present invention, include, but are not limited to, N,N'-dimethylaniline, N,N'-diethylaniline, triethylamine, triisobutylamine, diethanolamine, and triethanolamine. The organic base is preferably present in an amount ranging from 0.01 to 2.0 percent by weight based on the weight of the at least one compound capable of forming a photoresist pattern by a photo lithography process.

Figure 1B:
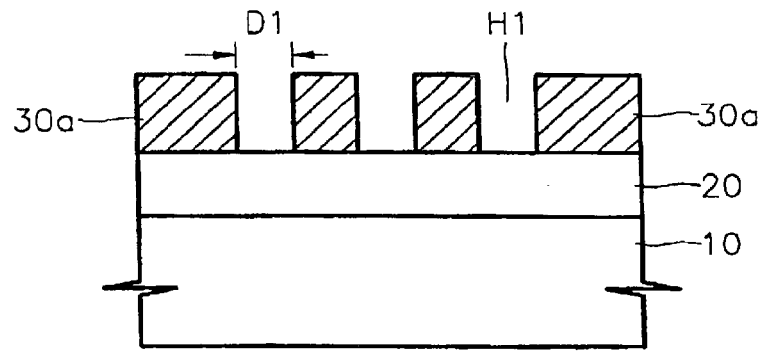

Referring to FIG. 1B, soft baking, exposure, post-exposure baking (PEB) and development are carried out on the resist compound layer 30 according to a general photolithography process. A photoresist pattern 30a results having a plurality of openings H1 present therein each exposing the target layer 30 through a width D1. The width D1 of one opening H1 has a size which can be obtained within the capability of conventional photolithography technology limited by the wavelength, and is typically larger than that of a fine pattern intended by the present invention.

The soft baking process may be performed under various conditions. For example, the soft baking process may be employed at from about 90° C. to about 150° C. for about 60 to about 120 seconds. Moreover, during the exposure process G-line, I-line, DUV, E-beams, or X-rays, may be used as an exposure tool, depending on the type of photoresist solution employed. As an example, the PEB process may be performed at a temperature of from about 90° C. to about 150° C. for about 60 to about 120 seconds.

Figure 1C:
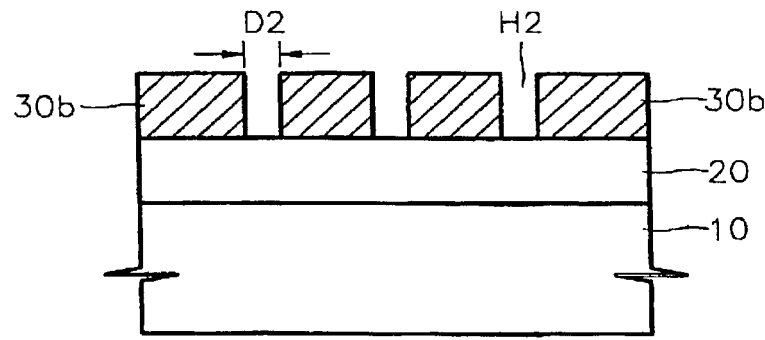

Referring to FIG. 1C, the photoresist pattern 30a is heated at a temperature which is preferably at least 10° C. higher than the transition temperature of the at least one compound capable of forming a photoresist pattern, such as, for example, from about 120° C. or 130° C. to about 170° C. Preferably, the heating step is carried out for a duration of from about 30 or 60 seconds to about 180 seconds, although other times may be employed. As a result of the heating, the resist composition of the photoresist pattern 30a starts to flow and simultaneously a crosslinking reaction partially occurs in the flowing resist composition due to the crosslinking agent that is activated at a temperature higher than the transition temperature. In the embodiment that employs free radical initiators as the crosslinking agents, free radicals are produced in the photoresist pattern 30a from the free radical initiators which are activated at a temperature higher than the transition temperature. Because of the presence of the free radicals, a partial cross-linking reaction occurs in the flowing resist composition.

While the photoresist pattern 30a is heated to a temperature higher than the transition temperature, a partial crosslinking reaction and the thermal flow of the resist composition are believed to simultaneously occur such that the overall flow rate of the photoresist pattern 30a can be more easily controlled. Thus, distortion of the profile of the photoresist pattern 30a at the side walls may be minimized. The species and amount of the crosslinking agent to be added, and the heating temperature and heating duration may be determined by one skilled in the art in order to potentially adjust the degree of cross-linking reaction such as by, for example, free radicals. Stated differently, the degree of crosslinking in the resist composition can be adjusted to a desired level by appropriately selecting the species of the crosslinking agent, and by appropriately selecting the heating temperature and the heating duration.

As a result of heating the photoresist pattern 30a to a temperature higher than the transition temperature of the at least one compound for a predetermined duration, a modified photoresist pattern 30b, having a plurality of reduced openings H2, each of which exposes the target layer 20 and has a desired width D2 smaller than the width D1, is formed as shown in FIG. 1C.

The resultant structure having the modified photoresist pattern 30b is then cooled to room temperature. The width D2 of the reduced opening H2 can be as small as about 0.05 to about 0.2 μm which may exceed the wavelength limit of a general photolithography process.

Heating the structure illustrated in FIG. 1C to a temperature higher than the transition temperature is performed only once in this embodiment, However, it should be appreciated by one skilled in the art that this heating process can be repeated many times as required. In this case, the heating temperature can be increased gradually in each step. It is preferable, however, that the temperature be cooled to room temperature after each heating step.

Figure 1D:
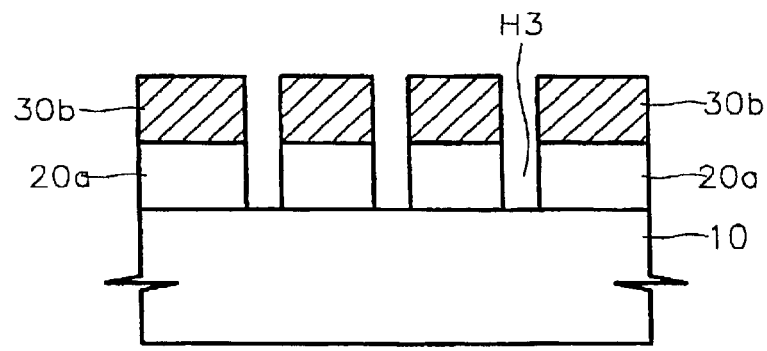

Referring to FIG. 1D, the target layer 20 exposed through the reduced openings H2 is dry etched using the modified photoresist pattern 30b as an etching mask. Pattern 20a having contact holes H3 exposing the semiconductor substrate 10 is thus formed.

The invention is believed to be advantageous. As described above, the methods of the invention allow for forming photoresist patterns using the resist composition described herein. By heating the temperature of the resist composition to a temperature higher than the transition temperature of the resist composition, a crosslinking reaction is effected simultaneously with the flow of the resist composition (which is activated by virtue of being exposed to the transition temperature) and the flow rate of the resist composition in the photoresist pattern can be more easily controlled. When openings in the photoresist pattern become sufficiently small because of a thermal flow process, distortion of the side walls of the resultant contact holes may be minimized. Thus, a vertical side wall profile may result which is highly desirable.

As emphasized herein, the present invention is not limited to the embodiments described herein. As an example, the invention may be applied to the formation of line end space patterns, in addition to the formation of fine patterns having small feature sizes of from about 0.05 to about 0.2 μm which goes beyond the wavelength limit in the conventional photolithography.

The examples are set forth to illustrate the invention and are not meant as a limitation thereon.

EXAMPLE 1

The dependency of the resist composition containing at least one compound capable of forming a photoresist pattern and a free radical initiator on temperature was evaluated as follows.

First, 10 gms of SEPR-430 (manufactured by ShinEtsu Co. of Tokyo, Japan) as a chemically amplified resist and 0.06 g of benzoyl peroxide (BPO) as a free radical initiator were mixed to obtain a resist composition. Then, a photoresist pattern having a plurality of openings of a size of 280 nm (1:2 pitch) was formed on a wafer using the resist compound by a general method.

A plurality of samples, i.e., wafers each having the photoresist pattern, were prepared and heated to 155° C., 160° C., 162° C. and 164° C., respectively, for 120 seconds to induce thermal flow of the photoresist pattern. The samples were then cooled at room temperature.

The opening size of each contact hole formed in each resultant modified photoresist pattern was measured under 0.4, 0.2 and 0 depth of focus (DOF), and the amount of flow of the photoresist pattern during the thermal process was calculated from the results. The results are shown in FIG. 2.

Figure 2:
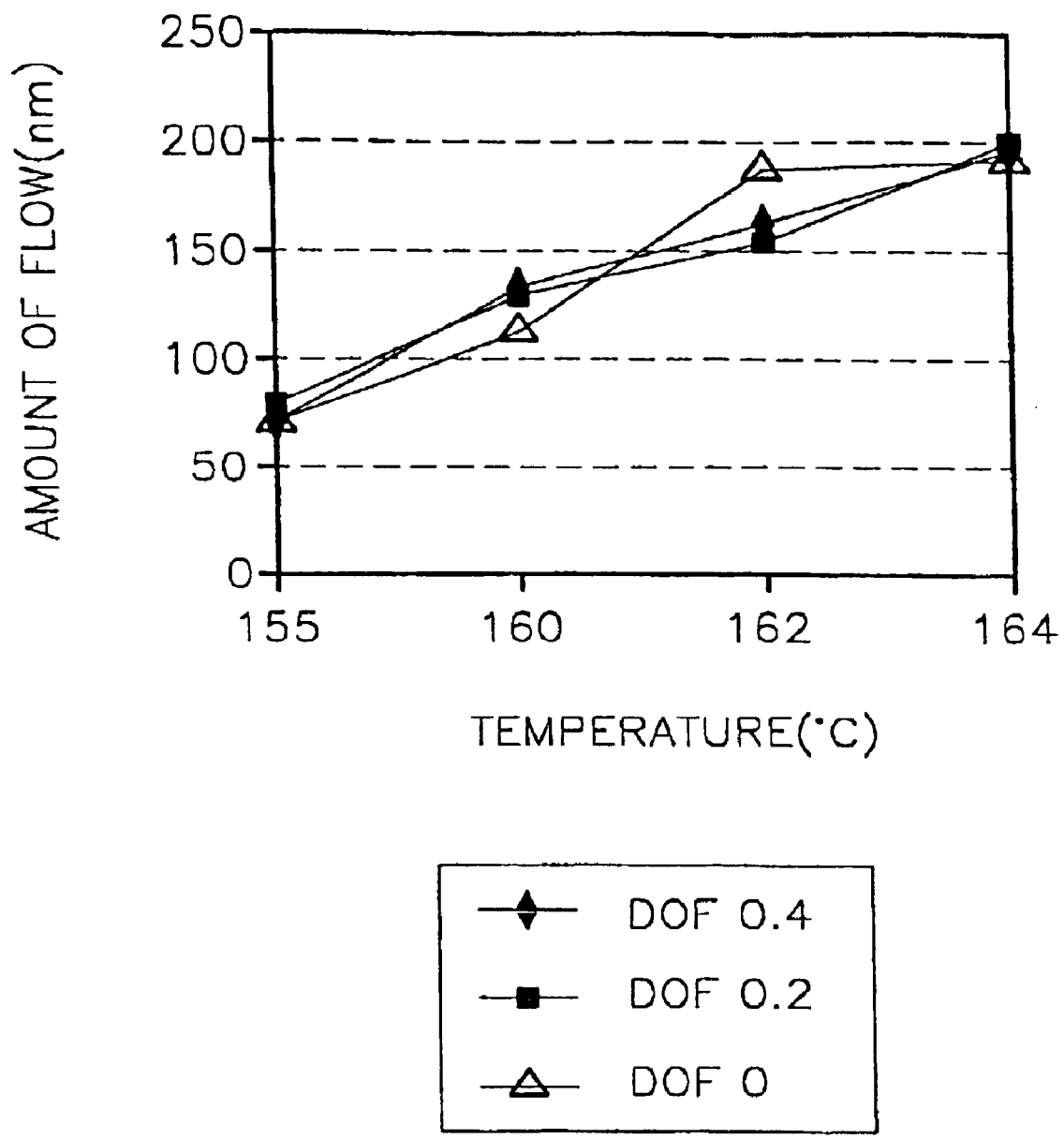
FIG. 2 is a graph illustrating the amount of flow of photoresist pattern with respect to the temperature of a thermal process, to evaluate the dependency on temperature of the resist compound according to the present invention.

FIG. 2 shows that when a photoresist pattern formed by the method for forming a fine pattern according to the present invention is caused to flow by application of heat, the amount of flow of the photoresist pattern linearly increases as the temperature of the thermal process increases. The minimal distortion of the photoresist pattern in all the modified photoresist patterns after thermal flow, resulting in contact holes each having vertical sidewalls is not illustrated in this figure. Also, it can be hypothesized that the higher the predetermined temperature of the thermal process, the smaller the opening size of the contact holes.

EXAMPLE 2

The effect of the content of the free radical initiator used as a crosslinking agent in the resist composition according to the present invention was evaluated as follows.

The DUV resist SEPR-430, commercially available from ShinEtsu Co. was employed as a chemically amplified resist, and 0, 4, 6 or 8 wt % of benzoyl peroxide (BPO) as a free radical initiator, were mixed to obtain a resist composition. Then, a photoresist pattern having a plurality of openings each having an opening size of 320 nm (1:2 pitch) was formed on each wafer using the resist composition by employing a general method. For the photoresist pattern, soft baking was carried out at 100° C. for 90 seconds and post-exposure baking (PEB) was performed at 115° C. for 90 seconds.

A plurality of samples, that is, wafers each having the photoresist pattern, were prepared and heated to 145° C., 150° C., 155° C., 160° C. and 165° C., respectively, for 120 seconds to induce thermal flow of the photoresist pattern, and then cooled at room temperature.

The opening size of each contact hole formed in each resultant modified photoresist pattern was measured, and the amount of flow of the photoresist pattern during the thermal process was calculated from the results. Table 1 below shows the results.

TABLE 1

| Resist compound | Temperature of thermal process (° C.) | ADI (nm) | AFI (nm) | Δ Flow (nm) | Profile |
|---|---|---|---|---|---|
| Resist + 0 wt % of BPO | 145 | 320 | 262 | 58 | Tapered |
| | 150 | 320 | 214 | 106 | Tapered |
| | 155 | 320 | 70 | 250 | Tapered |
| | 160 | 320 | 0 (open failure | Overflow | Distorted |
| | 165 | 320 | (open failure) | Overflow | Distorted |
| Resist + 4 wt % of BPO | 145 | 320 | 320 | 0 (no flow | vertical |
| | 150 | 320 | 290 | 30 | vertical |
| | 155 | 320 | 260 | 60 | vertical |
| | 160 | 320 | 120 | 200 | vertical |
| | 165 | 320 | (open failure) | Overflow | open failure |
| Resist + 6 wt % of BPO | 145 | 320 | 320 | 0 (no flow) | vertical |
| | 150 | 320 | 304 | 16 | vertical |
| | 155 | 320 | 286 | 34 | vertical |
| | 160 | 320 | 252 | 68 | vertical |
| | 165 | 320 | 86 | 234 | vertical |
| Resist + 8 wt % of BPO | 145 | 320 | 320 | 0 (no flow) | vertical |
| | 150 | 320 | 320 | 0 (no flow) | vertical |
| | 155 | 320 | 320 | 0 (no flow | vertical |
| | 160 | 320 | 320 | 0 (no flow) | vertical |
| | 165 | 320 | 308 | 12 | vertical |

In Table 1, "ADI" (After Development Inspection) describes the size of openings formed in a photoresist pattern after development. "AFI" (After Flow Inspection) describes the size of openings in the modified photoresist pattern obtained through thermal flow, and "Δ Flow" (The difference between the ADI and AFI) indicates the amount of flow of the photoresist pattern. Also, in the column of "Profile", the profile of the contact holes at the side walls, formed in the modified photoresist pattern, are described.

EXAMPLE 3

Table 2 shows the results of an experiment conducted in order to investigate the effect content of the free radical initiator contained in the resist composition. An i-line resist ip3300, commercially available from Tokyo Ohka Kogyo Co. of Tokyo, Japan, was employed and 0 wt % and 8 wt % of BPO based on the weight of the resist, as a free radical initiator, were added to the resist to prepare resist compositions.

Then, a photoresist pattern having a plurality of openings of the size of 510 nm was formed on wafers using those compounds formed by a general method. For the photoresist pattern, soft baking was carried out at 110° C. for 90 seconds and PEB was performed at 110° C. for 90 seconds.

A plurality of samples, that is, wafers each having the photoresist pattern, were prepared and heated to 150° C., 155° C., 157° C. and 159° C., respectively, for 120 seconds to lead a thermal flow of the photoresist pattern, and then cooled at room temperature.

The opening size of each contact hole formed in each resultant modified photoresist pattern was measured, and the amount of flow of the photoresist pattern during the thermal process was calculated from the results. The results are shown in Table 2.

In Table 2, "ADI", "AFI", "Δ Flow" and "Profile" have the same meanings as set forth in Table 1. From the results of the Examples 2 and 3, it can be seen that it may be possible to control the opening size of the contact holes formed in the modified photoresist pattern which is obtained through thermal flow using the resist composition according to the present invention. Also, as the content of the crosslinking agent (e.g., free radical initiator) in the resist composition increases, the amount of flow of the photoresist pattern may decrease, and relatively larger contact holes can be formed. Therefore, by adjusting the content of the crosslinking agent in the resist composition, contact holes having a desired size can be obtained.

TABLE 2

| Resist compound | Temperature of thermal process (° C.) | ADI (nm) | AFI (nm) | Δ Flow (nm) | Profile |
|---|---|---|---|---|---|
| Resist + 0 wt % of BPO | 150 | 510 | 196 | 314 | Tapered |
| | 155 | 510 | 10 | 500 | Tapered |
| | 157 | 510 | 0 (open failure) | Overflow | Distorted |
| | 159 | 510 | 0 (open failure | Overflow | Distorted |
| Resist + 6 wt % of BPO | 150 | 510 | 425 | 85 | Vertical |
| | 155 | 510 | 262 | 248 | Vertical |
| | 157 | 510 | 190 | 320 | Vertical |
| | 159 | 510 | 124 | 386 | Vertical |

Hereinafter, detailed embodiments for forming fine contact holes in a semiconductor substrate by the method according to the present invention will now be described.

EXAMPLE 4

0.06 g of BPO was employed as a free radical initiator was added to 10 gms of the i-line resist solution ip-3300, commercially available from Tokyo Ohka Kogyo Co. The mixture was completely dissolved, resulting in a resist composition. The mixture was filtered through a 0.2 μm membrane filter. The resist composition was coated on a silicon wafer treated with hexamethyldisilazane (HMDS) to a thickness of about 0.7 µm.

Soft baking was carried out on the wafer coated with the resist composition at 100° C. for 90 seconds, the resultant structure was exposed using an i-line stepper having a numerical aperture of 0.63, and post-exposure baking (PEB) was performed at 100° C. for 90 seconds. Then, the resultant structure was developed using 2.38 wt % of tetramethylammonium hydroxide (TMAH) solution, resulting in a photoresist pattern having a plurality of openings with an opening size of 0.35 µm (1:2 pitch).

The wafer on which the photoresist pattern had been formed was heated at 150° C. for 120 seconds to induce thermal flow of the photoresist pattern. The wafer was thereafter cooled to room temperature, to form a modified photoresist pattern having a plurality of contact holes with an opening size of 0.3 µm.

EXAMPLE 5

0.06 g of BPO as a free radical initiator and 2 mg of N,N'-diethylaniline as an organic base were added to 10 gms of the i-line resist solution ip-3300, commercially available from Tokyo Ohka Kogyo Co. These compounds and completely dissolved, resulting in a resist composition. The mixture was filtered through a 0.2 µm membrane filter. The resist composition was then coated on a silicon wafer treated with HMDS to a thickness of about 0.7 µm.

Soft baking was carried out on the wafer coated with the resist composition at 100° C. for 90 seconds. The resultant structure was then exposed using an i-line stepper having a numerical aperture of 0.63, and PEB was performed at 100° C. for 90 seconds. Then, the resultant structure was developed using 2.38 wt % of TMAH solution, resulting in a photoresist pattern having a plurality of openings having an opening size of 0.35 µm (1:2 pitch).

The wafer on which the photoresist pattern had been formed, was heated at 130° C. for 120 seconds to lead thermal flow of the photoresist pattern (first heating step) and cooled to room temperature. Then, the resultant structure was heated for 120 seconds at 145° C. which is higher than the temperature in the first heating step, (second heating step). The structure was thereafter cooled to room temperature, resulting in a modified photoresist pattern having a plurality of contact holes with an opening size of 0.3 µm.

EXAMPLE 6

0.06 g of BPO was employed as a free radical initiator and was added to 10 gms of a DUV resist solution comprising acetal protected-polyhydroxystyrene resin, SEPR-430, commercially available from ShinEtsu Chemical Co. The contents were completely dissolved, and a resist composition resulted. The mixture was filtered through a 0.2 µm membrane filter. The resist composition was coated on a silicon wafer and treated with HMDS to a thickness of about 0.6 µm.

A soft baking process was carried out on the wafer coated with the resist composition at 100° C. for 90 seconds. The resultant structure was exposed using a KrF stepper having a numerical aperture of 0.45, and PEB was performed at 115° C. for 90 seconds. Then, the resultant structure was developed using 2.38 weight percent of TMAH solution, resulting in a photoresist pattern having a plurality of openings with an opening size of 0.30 µm (1:2 pitch).

The wafer in which the photoresist pattern had been formed, was heated to 158° C. for 120 seconds to induce thermal flow of the photoresist pattern. The wafer was then cooled to room temperature, resulting in a modified photoresist pattern having a plurality of contact holes with an opening size of 0.22 µm.

EXAMPLE 7

0.06 g of BPO was employed as a free radical initiator and 2 mg of N,N'-diethylaniline used as an organic base were added to 10 gms of the DUV resist solution, SEPR-430, commercially available from ShinEtsu Co. The contents were completely dissolved, resulting in a resist composition. The mixture was filtered through a 0.2 µm membrane filter. The resist composition was coated on a silicon wafer treated with HMDS to a thickness of about 0.6 µm.

A photoresist pattern having a plurality of openings with an opening size of 0.30 µm (1:2 pitch) was formed on a wafer under the same conditions as in Example 6. Then, in order to induce thermal flow of the photoresist pattern, the wafer on which the photoresist pattern had been formed, was heated to 140° C., which is the glass transition temperature of the resist, for 120 seconds (first heating step) and cooled to room temperature. Then, the resultant structure was heated to 160° C. which is higher than the temperature in the first heating step, for 120 seconds (second heating step). The structure was thereafter cooled to room temperature, resulting in a modified photoresist pattern having a plurality of contact holes with an opening size of 0.20 µm.

EXAMPLE 8

0.06 g of cumyl peroxide as a free radical initiator was added to 10 gms of the DUV resist solution UV-III, commercially available from Shipley Co. of Philadelphia, Pa. The contents were completely dissolved, resulting in a resist composition. The mixture was filtered through a 0.2 µm membrane filter. The resist composition was coated on a silicon wafer treated with HMDS to a thickness of about 0.6 µm.

Soft baking was carried out on the wafer coated with the resist composition at 130° C. for 90 seconds, and the resultant structure was exposed using a KrF stepper having a numerical aperture of 0.45. PEB was thereafter performed at 140° C. for 90 seconds. Then, the resultant structure was developed using 2.38 wt % of TMAH solution, resulting in a photoresist pattern having a plurality of openings with an opening size of 0.30 µm (1:2 pitch).

Then, in order to control the thermal flow of the photoresist pattern, the wafer on which the photoresist pattern had been formed was heated to 142° C., for 120 seconds (first heating step). This temperature is close to the glass transition temperature of the resist. The wafer was thereafter cooled to room temperature. Then, the resultant structure was heated to 160° C. which is higher than the temperature in the first heating step, for 120 seconds (second heating step). The wafer was thereafter cooled to room temperature, resulting in a modified photoresist pattern having a plurality of contact holes with an opening size of 0.20 µm.

EXAMPLE 9

0.06 g of tert-butyl peroxide as a free radical initiator was added to 10 gms of the DUV resist solution UV-III, commercially available from the Shipley Chemical Co. The contents were completely dissolved resulting in a resist composition. The mixture was filtered through a 0.2 µm membrane filter. The resist composition was coated on a silicon wafer treated with HMDS to a thickness of about 0.6 μm.

A photoresist pattern having a plurality of openings with an opening size of 0.30 μm (1:2 pitch) was formed on a wafer under the same conditions as in Example 8. Then, in order to control the thermal flow of the photoresist pattern, the wafer on which the photoresist pattern had been formed was heated to 145° C. for 120 seconds (first heating step), which is close to the glass transition temperature of the resist. The wafer was thereafter cooled to room temperature. Then, the resultant structure was heated to 160° C. which was higher than the temperature in the first heating step, for 120 seconds (second heating step). The structure is thereafter cooled to room temperature. A modified photoresist pattern having a plurality of contact holes with an opening size of 0.20 μm was formed.

EXAMPLE 10

1.0 g of poly(methyl methacrylate$_{30}$-t-butyl methacrylate$_{40}$-methacrylic acid$_{30}$) (weight average molecular weight=13,500) and 0.02 g of triphenylsulfonium nonaflate as a photo acid generator were dissolved in propylene glycol monomethyl ether acetate (PGMEA) to prepare a resist solution. 0.06 g of tert-butyl peroxide as a free radical initiator and 2 mg of N,N'-diethylaniline as an organic base were then added to the resist solution and completely dissolved therein, resulting in a resist composition. The mixture was then filtered through a 0.2 μm membrane filter. Then, the resist composition was coated on a silicon wafer and treated with HMDS such that a thickness of about 0.5 μm was achieved.

Soft baking was carried out on the wafer coated with the resist composition at 130° C. for 90 seconds. The resultant structure was exposed using an ArF stepper having a numerical aperture of 0.60, and PEB was performed at 140° C. for 90 seconds. Then, the resultant structure was developed using 0.14 weight percent of TMAH solution. A photoresist pattern resulted having a plurality of openings with an opening size of 0.30 μm (1:2 pitch). The wafer in which the photoresist pattern had been formed was heated to 165° C. for 120 seconds to induce thermal flow of the photoresist pattern. The wafer was then cooled to room temperature, resulting in a modified photoresist pattern having a plurality of contact holes with an opening size of 0.20 μm.

EXAMPLE 11

0.06 g of BPO was employed as a free radical initiator was added to 10 gms of the i-line resist solution ip-3300, commercially available from Tokyo Ohka Kogyo Co. The mixture was completely dissolved, resulting in a resist composition. The mixture was filtered through a 0.2 μm membrane filter. The resist composition was coated on as silicon wafer treated with hexamethyldisilazane (HMDS) to a thickness of about 0.7 μm.

Soft baking was carried out on the wafer coated with the resist composition at 100° C. for 90 seconds, the resultant structure was exposed using an i-line stepper having a numerical aperture of 0.63, and PEB was performed at 100° C. for 90 seconds. Then, the resultant structure was developed using 2.38 wt % of tetramethylammonium hydroxide (TMAH) solution, resulting in a photoresist pattern having a plurality of openings with an opening size of 0.35 μm (1:2 pitch).

The wafer on which the photoresist pattern had been formed was heated at 150° C. for 120 seconds to induce thermal flow of the photoresist pattern. A modified photoresist pattern resulted having a plurality of contact holes with an opening size of 0.3 μm.

EXAMPLE 12

0.06 g of BPO was employed as a free radical initiator and 2 mg of N,N'-diethylaniline used as an organic base were added to 10 gms of the DUV resist solution, SEPR-430, commercially available from ShinEtsu Co. The contents were completely dissolved, resulting in a resist composition. The mixture was filtered through a 0.2 μm membrane filter. The resist composition was coated on a silicon wafer treated with HMDS to a thickness of about 0.6 μm.

A photoresist pattern having a plurality of openings with an opening size of 0.30 μm (1:2 pitch) was formed on a wafer under the same conditions as in Example 6. Then, in order to induce thermal flow of the photoresist pattern, the wafer on which the photoresist pattern had been formed was heated to 160° C. for 120 seconds. The structure was thereafter cooled to room temperature, resulting in a modified photoresist pattern having a plurality of contact holes with an opening size of 0.20 μm.

EXAMPLE 13

0.06 g of cumyl peroxide as a free radical initiator was added to 10 gms of the DUV resist solution UV-III, commercially available from Shipley Co. of Philadelphia, Pa. The contents were completely dissolved, resulting in a resist composition. The mixture was filtered through a 0.2 μm membrane filter. The resist composition was coated on a silicon wafer treated with HMDS to a thickness of about 0.6 μm.

Soft baking was carried out on the wafer coated with the resist composition at 130° C. for 90 seconds, and the resultant structure was exposed using a KrF stepper having a numerical aperture of 0.45. PEB was thereafter performed at 140° C. for 90 seconds. Then, the resultant structure was developed using 2.38 wt % of TMAH solution, resulting in a photoresist pattern having a plurality of openings with an opening size of 0.30 μm (1:2 pitch).

Then, in order to control the thermal flow of the photoresist pattern, the wafer on which the photoresist pattern had been formed was heated to 155° C. for 120 seconds. The wafer was thereafter cooled to room temperature, resulting in a modified photoresist pattern having a plurality of contact holes with an opening size of 0.20 μm.

EXAMPLE 14

0.06 g of tert-butyl peroxide as a free radical initiator was added to 10 gms of the DUV resist solution UV-III, commercially available from the Shipley Chemical Co. The contents were completely dissolved resulting in a resist composition. The mixture was filtered through a 0.2 μm membrane filter. The resist composition was coated on a silicon wafer treated with HMDS to a thickness of about 0.6 μm.

A photoresist pattern having a plurality of openings with an opening size of 0.30 μm (1:2 pitch) was formed on a wafer under the same conditions as in Example 13. Then, in order to induce the thermal flow of the photoresist pattern, the wafer on which the photoresist pattern had been formed is heated to 158° C. for 120 seconds. The structure is thereafter cooled to room temperature. A modified photoresist pattern having a plurality of contact holes with an opening size of 0.20 μm was formed.

The resist composition according to the present invention may be formed by mixing the at least one compound present in a solution with a crosslinking agent, selected according to the type of at least one compound contained in the resist composition (e.g., solution). The crosslinking agent preferably causes an appropriate crosslinking reaction at a temperature allowing for thermal flow of the photoresist pattern, without affecting performance of the resist composition. Therefore, when contact holes are formed in a semiconductor substrate using the resist composition by the method according to the present invention, the flow rate of the resist composition in the photoresist pattern can be more easily controlled with minimal distortion of the vertical profile of the photoresist pattern.

Therefore, even after the thermal flow occurs, the overall flow rate of the photoresist pattern can be more uniformly controlled, so that distortion of the profile of the contact holes at the side walls can be minimized. A vertical side wall profile may be thus maintained. By employing the method for forming a fine pattern according to the present invention, it is possible to obtain a photoresist pattern having fine openings which is beyond the capability of the general photolithography technology limited by the wavelength of the exposure light.

While this invention has been particularly shown and described with reference to preferred embodiments thereof, it will be understood by those skilled in the art that various changes in form and details may be made therein without departing from the spirit and scope of the invention as defined by the appended claims.

What is claimed:

1. A method for forming a fine pattern in a semiconductor substrate, comprising the steps of:
   (a) coating a target layer to be etched on a semiconductor substrate with a resist composition, the resist composition comprising at least one compound capable of forming a photoresist pattern by a photolithography process and a thermal crosslinking agent capable of causing a partial crosslinking reaction in the resist composition in response to a temperature equal to or higher than the glass transition temperature or the softening temperature of the at least one compound and in the absence of UltraViolet (UV) radiation, wherein said coating step results in forming a resist compound layer comprising the resist composition;
   (b) performing a lithography process on the resist compound layer to form a photoresist pattern of at least one opening having a first width, where the target layer is exposed through the first width; and
   (c) heating the resist compound layer having the photoresist pattern formed therein to a temperature equal to or higher than the glass transition temperature or the softening temperature of the at least one compound, to thereby cause a partial cross-linking reaction in the resist composition resulting in a modified photoresist pattern having at least one opening having a second width which exposes the target layer, wherein said second width is smaller than the first width.

2. The method of claim 1, wherein said step of heating the resist compound layer having the photoresist pattern formed therein comprises heating the resist compound layer having the photoresist pattern formed therein to a temperature equal to or higher than the glass transition temperature or the softening temperature of the at least one compound such that the resist compound layer flows.

3. The method of claim 1, wherein the at least one opening having a first width comprises a plurality of openings.

4. The method of claim 1, wherein the at least one opening having a second width comprises a plurality of openings.

5. The method of claim 1, wherein said step of heating the resist compound layer having the photoresist pattern formed therein to a temperature equal to or higher than the glass transition temperature or the softening temperature of the resist composition comprises heating the resist compound layer to a temperature that exceeds the glass transition temperature by a temperature ranging from about 5° C. to about 20° C.

6. The method of claim 1, wherein said step of heating the resist compound layer having the photoresist pattern formed therein to a temperature equal to or higher than the glass transition temperature or the softening temperature of the resist is carried out from about 60 to about 180 seconds.

7. The method of claim 1, wherein said step of heating the resist compound layer is performed at a temperature of at least about 10° C. greater than the glass transition temperature or the softening temperature of the at least one compound.

8. The method of claim 1, wherein said step of heating the resist compound layer is performed at a temperature of from about 130° C. to about 170° C.

9. The method of claim 1, wherein said step of heating the resist compound layer occurs from about 30 seconds to about 3 minutes.

10. The method of claim 1, wherein said step of heating the resist compound layer is performed at a temperature of from about 130° C. to about 170° C. and from about 30 seconds to about 3 minutes.

11. The method of claim 1, wherein said at least one compound is selected from the group consisting of a Novolak resin, a diazonaphthoquinone compound, and mixtures thereof.

12. The method of claim 1, wherein said resist composition is a chemically amplified resist composition comprising a photo acid generator.

13. The method of claim 1, wherein said crosslinking agent is a vinylether derivative.

14. The method of claim 13, wherein the vinylether derivative is represented by the formula:

wherein x is an integer ranging from 2 to 4; and R is a $C_1$ to $C_{20}$ hydrocarbon or an oligomer having a weight average molecular weight ranging from about 500 to about 5000.

15. The method of claim 1, wherein said crosslinking agent is present in an amount from about 1 to about 20 percent based on the weight of polymer present in said at least one compound.

16. The method of claim 1, wherein said crosslinking agent is selected from the group consisting of 1,4-butandiol divinylether, tri(ethyleneglycol)divinylether, trimethyolpropane trivinyl ether, 1,4-cyclohexanedimethanol divinyl ether, and mixtures thereof.

17. The method of claim 1, wherein said crosslinking agent is a free radical initiator.

18. The method of claim 17, wherein the free radical initiator is present in an amount of from about 1 to about 15 percent based on the weight of polymer present in said at least one compound.

19. The method of claim 17, wherein the resist composition comprises from about 3 to about 15 percent by weight of said free radical initiator based on the weight of the solids in the resist composition.

20. The method of claim 17, wherein said free radical initiator is selected from the group consisting of acyl peroxides, alkyl peroxides, peresters, hydroperoxides, azo compounds, and mixtures thereof.

21. The method of claim 17, wherein said free radical initiator is selected from the group consisting of benzoyl peroxide, dicumyl peroxide, di-tert-butyl peroxide, cumyl hydroperoxide, azobis (isobutyronitrile), and mixtures thereof.

22. The method of claim 1, wherein said resist composition further comprises an organic base.

23. The method of claim 22, wherein the organic base is present in an amount of from about 0.01 to about 2.0 percent by weight based on the at least one compound.

24. The method of claim 22, wherein the organic base is one selected from the group consisting of N,N'-dimethylaniline, N,N'-diethylaniline, triethylamine, triisobutylamine, diethanolamine, triethanolamine, and mixtures thereof.

25. A method for forming a fine pattern in a semiconductor substrate, comprising the steps of:
  (a) coating a target layer to be etched on a semiconductor substrate with a resist composition, the resist composition comprising at least one compound capable of forming a photoresist pattern by a photolithography process and a crosslinking agent capable of causing a partial crosslinking reaction in the resist composition at a temperature equal to or higher than the glass transition temperature or the softening temperature of the at least one compound and in the absence of UltraViolet (UV) radiation, wherein said coating step results in forming a resist compound layer comprising the resist composition;
  (b) performing a lithography process on the resist compound layer to form a photoresist pattern of at least one opening having a first width and sidewalls that are orthogonal to the target layer, where the target layer is exposed through the first width; and
  (c) heating the resist compound layer having the photoresist pattern formed therein to a temperature equal to or higher than the glass transition temperature or the softening temperature of the at least one compound, and wherein a partial cross-linking reaction in the resist composition resulting in a modified photoresist pattern having at least one opening having a second width which exposes the target layer and sidewalls that are orthogonal to the target layer, wherein said second width is smaller than the first width.

26. The method of claim 25, wherein said step of heating the resist compound layer having the photoresist pattern formed therein comprises heating the resist compound layer having the photoresist pattern formed therein to a temperature equal to or higher than the glass transition temperature or the softening temperature of the at least one compound such that the resist compound layer flows.

27. The method of claim 25, wherein the at least one opening having a first width comprises a plurality of openings.

28. The method of claim 25, wherein the at least one opening having a second width comprises a plurality of openings.

29. The method of claim 25, wherein said step of heating the resist compound layer having the photoresist pattern formed therein to a temperature equal to or higher than the glass transition temperature or the softening temperature of the resist composition comprises heating the resist compound layer to a temperature that exceeds the glass transition temperature by a temperature ranging from about 5° C. to about 20° C.

30. The method of claim 25, wherein said step of heating the resist compound layer having the photoresist pattern formed therein to a temperature equal to or higher than the glass transition temperature or the softening temperature of the resist is carried out from about 60 to about 180 seconds.

31. The method of claim 25, wherein said step of heating the resist compound layer is performed at a temperature of at least about 10° C. greater than the glass transition temperature or the softening temperature of the at least one compound.

32. The method of claim 25, wherein said step of heating the resist compound layer is performed at a temperature of from about 130° C. to about 170° C.

33. The method of claim 25, wherein said step of heating the resist compound layer occurs from about 30 seconds to about 3 minutes.

34. The method of claim 25, wherein said step of heating the resist compound layer is performed at a temperature of from about 130° C. to about 170° C. and from about 30 seconds to about 3 minutes.

35. The method of claim 25, wherein said at least one compound is selected from the group consisting of a Novolak resin, a diazonaphthoquinone compound, and mixtures thereof.

36. The method of claim 25, wherein said resist composition is a chemically amplified resist composition comprising a photo acid generator.

37. The method of claim 25, wherein said crosslinking agent is a vinylether derivative.

38. The method of claim 37, wherein the vinylether derivative is represented by the formula:

wherein x is an integer ranging from 2 to 4; and R is a $C_1$ to $C_{20}$ hydrocarbon or an oligomer having a weight average molecular weight ranging from about 500 to about 5000.

39. The method of claim 25, wherein said crosslinking agent is present in an amount from about 1 to about 20 percent based on the weight of polymer present in said at least one compound.

40. The method of claim 25, wherein said crosslinking agent is selected from the group consisting of 1,4-butandiol divinylether, tri(ethyleneglycol)divinylether, trimethyolpropane trivinyl ether, 1,4-cyclohexanedimethanol divinyl ether, and mixtures thereof.

41. The method of claim 25, wherein said crosslinking agent is a free radical initiator.

42. The method of claim 41, wherein the free radical initiator is present in an amount of from about 1 to about 15 percent based on the weight of polymer present in said at least one compound.

43. The method of claim 41, wherein the resist composition comprises from about 3 to about 15 percent by weight of said free radical initiator based on the weight of the solids in the resist composition.

44. The method of claim 41, wherein said free radical initiator is selected from the group consisting of acyl peroxides, alkyl peroxides, peresters, hydroperoxides, azo compounds, and mixtures thereof.

45. The method of claim 41, wherein said free radical initiator is selected from the group consisting of benzoyl peroxide, dicumyl peroxide, di-tert-butyl peroxide, cumyl hydroperoxide, azobis (isobutyronitrile), and mixtures thereof.

46. The method of claim 25, wherein said resist composition further comprises an organic base.

47. The method of claim 46, wherein the organic base is present in an amount of from about 0.01 to about 2.0 percent by weight based on the at least one compound.

48. The method of claim 46, wherein the organic base is one selected from the group consisting of N,N'-dimethylaniline, N,N'-diethylaniline, triethylamine, triisobutylamine, diethanolamine, triethanolamine, and mixtures thereof.

* * * * *